United States Patent [19]

Usui et al.

[11] Patent Number: 4,797,638
[45] Date of Patent: Jan. 10, 1989

[54] OSCILLATOR INCLUDING A TRANSISTOR USED BOTH AS CONSTANT CURRENT SOURCE AND AMPLIFIER

[75] Inventors: Akira Usui, Takatsuki; Kazuhiko Kubo, Osaka; Hiroyuki Nagai, Ibaraki, all of Japan

[73] Assignee: Matsushita Electric Industrial Co., Ltd., Kadoma, Japan

[21] Appl. No.: 30,852

[22] PCT Filed: Jul. 14, 1986

[86] PCT No.: PCT/JP86/00359
§ 371 Date: Apr. 10, 1987
§ 102(e) Date: Apr. 10, 1987

[87] PCT Pub. No.: WO87/00993
PCT Pub. Date: Feb. 12, 1987

[30] Foreign Application Priority Data

Jul. 30, 1985 [JP] Japan ................. 60-167924
Jul. 30, 1985 [JP] Japan ................. 60-167925
Sep. 26, 1985 [JP] Japan ................. 60-213105

[51] Int. Cl.⁴ .......................... H03B 5/18; H03B 5/12
[52] U.S. Cl. ............................ 331/117 D; 331/177 V
[58] Field of Search .......... 331/117 R, 117 D, 116 R, 331/117 FE, 116 FE, 177 V; 332/30 V

[56] References Cited

U.S. PATENT DOCUMENTS 3,813,615 5/1974 Okazaki ............ 331/177 V X
4,494,081 1/1985 Lea et al. ............ 331/177 V X
4,536,724 8/1985 Hasegawa et al. ......... 331/177 V

FOREIGN PATENT DOCUMENTS 2039695 2/1972 Fed. Rep. of Germany .
59-149405 8/1984 Japan .

OTHER PUBLICATIONS

Draper, D.: Recent developments in solid state sources for microwave instrumentation, in: Electronic Engineering, Jan. 1974, pp. 54-56, 58.

Primary Examiner—Siegfried H. Grimm
Attorney, Agent, or Firm—Cushman, Darby & Cushman

[57] ABSTRACT

The local oscillation circuit in accordance with the present invention is characterized as follows. The collector of an oscillation transistor is grounded for alternating current. A series resonance circuit consisting of a variable capacitance diode and a resonator is connected to the base of the oscillation transistor. The other end of the series resonance circuit is grounded for alternating current. The emitter of the oscillation transistor is connected to the collector of an amplifying transistor. The emitter is grounded through a capacitor that removes or reduces the a.c. component and passes the d.c. component. An oscillation signal taken from the emitter of the oscillation transistor is fed to the base of the amplifier transistor. A local oscillation output signal is taken from the collector of the amplifier transistor, and bias potential to the amplifier transistor is impressed from the power source to the base of the amplifier transistor. With this arrangement, the current in the oscillation transistor is stabilized, even with a change in the d.c. control voltage supplied to the resonance circuit, to improve the reliability and performance of the circuit.

4 Claims, 6 Drawing Sheets

OSCILLATOR INCLUDING A TRANSISTOR USED BOTH AS CONSTANT CURRENT SOURCE AND AMPLIFIER

BACKGROUND OF THE INVENTION

1. Field of the Art

The present invention relates to a local oscillation circuit which is usable as a tuner circuit in a television receiver, a CATV converter or an indoor unit of satellite receiver.

2. Background of the Prior Art

Recently, with the spread of CATV, multi channel receiving in television tuners and hence, an up-down type tuner or CATV converter is necessary. In one system, an input signal is converted to an intermediate frequency signal of higher frequency than the received signal and the intermediate frequency signal is then converted to a second intermediate frequency signal after passing through a narrow width band-pass filter (for example, published unexamined patent application SHO No. 59-149405). A feature of the system is that multi-channel receiving is achieved using simple structure by varying an oscillation frequency of a local oscillator in a range of over 1 GHz. The local oscillation circuit disclosed in published unexamined patent application SHO No. 59-149405 will now be described with reference to the Figures.

In FIG. 1, the local oscillation circuit is comprised of an oscillation amplifier 1, a resonance circuit 2, and can vary its oscillation frequency by an external tuning DC voltage impressed on a terminal 1A. The oscillation output signal is amplified in an amplifier 3 and fed to an external load circuit through an output terminal IB. The amplifier 3 operates as a buffer for the external load circuit and improves the local oscillation circuit.

FIG. 2 shows a circuit diagram of FIG. 1. Blocks encircled by broken lines correspond to blocks in FIG. 1. The amplifier 1 for oscillation is provided in a manner that the collector of an oscillation transistor $Q_1$ is grounded with regard to alternating current through a by-pass capacitor to make a negative impedance seen from the base of the oscillation transistor $Q_1$. Bias resistor $R_1$ is connected between the collector and base of oscillation transistor $Q_1$. The base of the oscillation transistor $Q_1$ is connected through a coupling capacitor $C_2$. A series resonant circuit is formed by a variable capacitance diode $D_1$, a resonant inductance $L_1$, and the internal capacitance of the transistor $Q_1$. By grounding the other end of the series resonant circuit with regard to alternating current, negative gain seen from the base of transistor $Q_1$ and loss of resonant inductance $L_1$ are offset, and it oscillates with such a frequency that the phase characteristics seen from the base of transistor $Q_1$ become $2n\pi (n=0,1,2,3\ldots)$rad.

By varying a tuning D.C. voltage impressed on a terminal 1A, the capacitance of the variable capacitance diode $D_1$ varies, and amplitude and phase characteristics vary. The tuning voltage passes through bias resistor $R_4$. By-pass capacitor $C_6$ is grounded from the terminal 1A. The oscillation output signal is obtained at a common connection point between the emitter of transistor $Q_1$ and a choke coil $L_2$ by grounding the emitter of transistor $Q_1$ with regard to direct current through a resistor $R_3$ with connected in series choke coil $L_2$ to the emitter of transistor $Q_1$. The oscillation output signal is fed to the base of an amplifier transistor $Q_2$ through a coupling capacitor $C_3$. A potential is applied to the base of transistor $Q_2$ from a source voltage Vcc impressed on a terminal 1D through a choke coil $L_3$ and resistor $R_6$. The emitter of amplifier transistor $Q_2$ is grounded and the collector of transistor $Q_2$ is connected to the terminal 1D through the choke coil $L_3$. The amplified oscillation output signal is fed to the exterior load from the collector of transistor $Q_2$ through a coupling capacitor $C_5$ and an output terminal 1B.

Two problems exist in the prior art of FIGS. 1 and 2. The first one is that when the tuning potential impressed on the terminal 1A is varied, a current flowing in the oscillation transistor $Q_1$ varies a great amount with changes in frequency, for example, from 15 mA to 35 mA. This variation is not suitable for use with the oscillation transistor, and the current in some cases happens to go over an allowable collector dissipation PC. A second shortcoming is that because of the structure of amplifier 3 shown in FIG. 2, a current of around 15 mA becomes necessary, and electric power consumption in the whole circuit increases.

Also, in the circuit shown in FIG. 2, the variable frequency range of the oscillator is limited. This is because the resonance capacitance is a series combination of the parallel sum of the capacitances of the variable capacitance diode, the stray capacitance of the circuit, and the input capacitance (mainly reverse bias capacitance Cob) of oscillation transistor $Q_1$. The variable frequency range of the oscillator is limited mainly by the reverse bias capacitance Cob of oscillation transistor $Q_1$.

The circuit shown in FIGS. 3 and 4 attempts to increase the frequency range. The base voltage of oscillation transistor $Q_1$ is changed by inputting an external change-over d.c. voltage to a terminal 1E through a resistor $R_7$. When a voltage of the terminal 1E becomes high, the base voltage of oscillation transistor $Q_1$ rises, and the collector current of oscillation transistor $Q_1$ increases. The reverse bias capacitance Cob of the oscillation transistor increases correspondingly to the increase of the collector current. The collector of transistor $Q_1$ is also fed with a current from a power source Vcc at terminal 1C through a resistor $R_2$. The collector potential of oscillation transistor $Q_1$ drops with the increase of the collector current, and the reverse bias voltage between the base and the collector becomes smaller, and therefore causes the capacitance Cob to increase. Because the capacitance inserted in series against the resonance circuit 2 increases with increasing reverse bias capacitance Cob, the oscillation frequency as a whole shifts toward a lower frequency. This is advantageous because the variable range of frequency at the low frequency end can be extended, in contrast with the circuit of FIGS. 1 and 2 where this is not the case.

However, even in the prior art shown in FIGS. 3 and 4, there are similar problems as exist in the circuit shown in FIGS. 1 and 2. First, the current flowing in the oscillation transistor $Q_1$ increases a great amount, for example, from 20 mA to 40 mA, when the change-over potential impressed on the terminal 1E is made high, and it often exceeds the allowable collector dissipating PC of the oscillation transistor. The second shortcoming is that electric power consumed in the whole circuit increases in a way similar to that of the circuits in FIG. 1 and FIG. 2.

SUMMARY OF THE INVENTION

The present invention provides a local oscillation circuit that keeps variation of the whole current to a minimum even with variations in the tuning potential.

Further, the present invention provides a local oscillation circuit wherein the whole current can be kept to a minimum level without variation even when making the external change-over voltage high.

The local oscillation circuit in accordance with the present invention is characterized as follows. The collector of an oscillation transistor is grounded for alternating current. A series resonance circuit consisting of a variable capacitance diode and a resonator is connected to the base of the oscillation transistor. The other end of the series resonance circuit is grounded for alternating current. The emitter of the oscillation transistor is connected to the collector of an amplifying transistor. The emitter is grounded through means which remove or reduce an a.c. component and pass a d.c. component. An oscillation signal taken from the emitter of the oscillation transistor is fed to the base of the amplifier transistor. A local oscillation output signal is taken from the collector of the amplifier transistor, and bias potential to the amplifier transistor is impressed from the power source to the base of the amplifier transistor.

According to the present invention, the current change of oscillation transistor can be reduced by connecting a constant current amplifier to the output side of an oscillator comprised of an oscillation amplifier and a resonance circuit. Current of the whole circuit current can be reduced because the constant current amplifier can be used to amplify the oscillation amplifier signal.

Further, the frequency variable range can be extended by varying the value of Cob caused by varying the base voltage of the oscillation transistor by a change-over voltage. Furthermore, the current change of the oscillation transistor can be reduced and thus the reliability of the circuit can be greatly improved. Therefore, the circuit is suitable for an up-down tuner or CATV converter.

BRIEF DESCRIPTION OF THE DRAWINGS

These and other advantages of the present invention may be appreciated from studying the following detailed description of the presently preferred exemplary embodiment together with the drawing in which.

DETAILED DESCRIPTION OF THE PREFERRED EMBODIMENT

Figure 1:
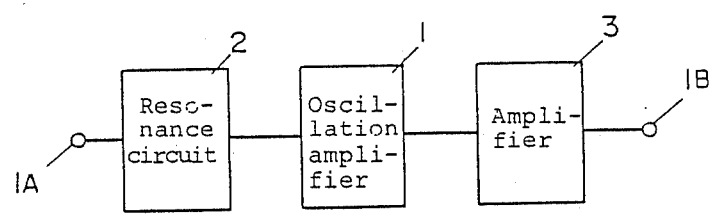
FIG. 1 is a block diagram of a conventional local oscillatio circuit.
Figure 2:
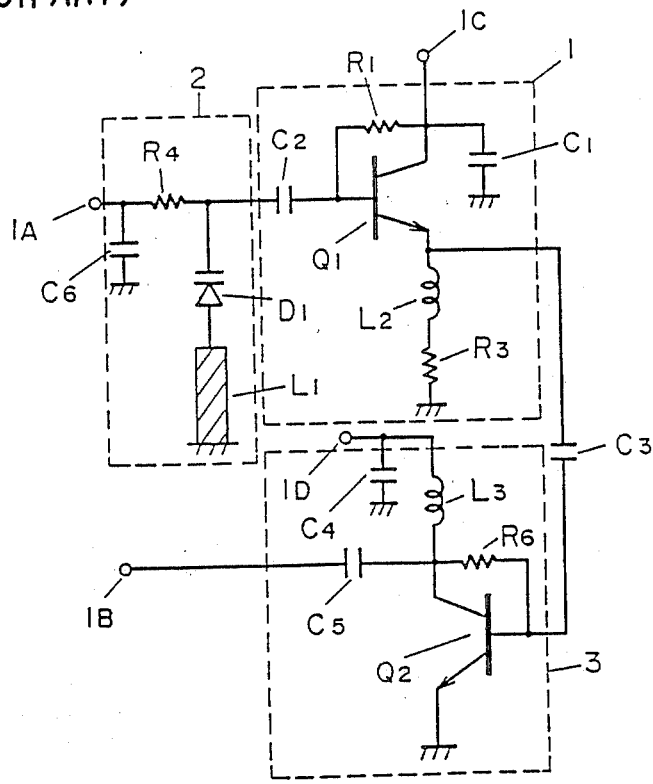
FIG. 2 is a circuit diagram of FIG. 1.
Figure 3:
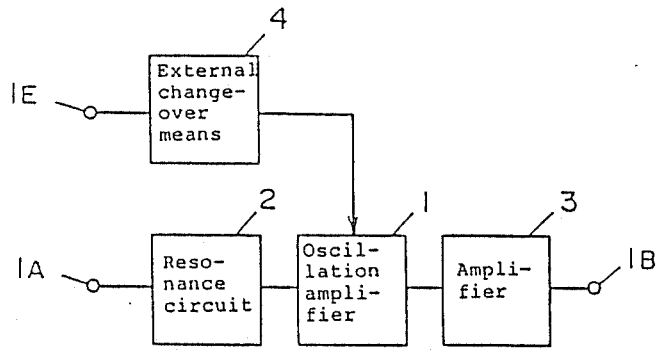
FIG. 3 is a block diagram of another conventional local oscillation circuit.
Figure 4:
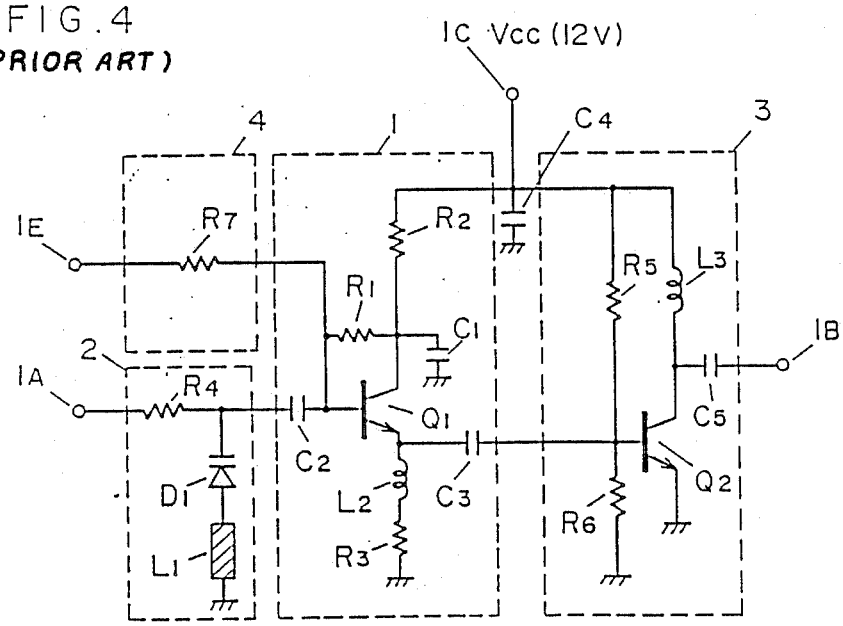
FIG. 4 is a circuit diagram of FIG. 3.
Figure 5:
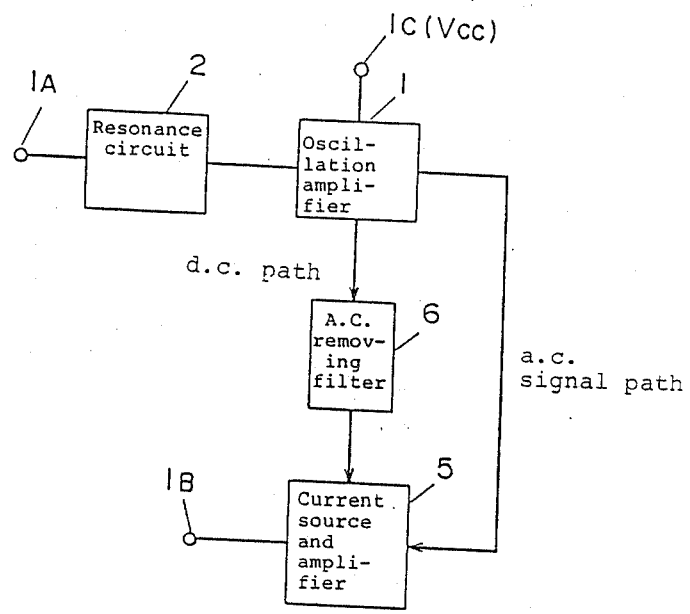
FIG. 5 is a block diagram of a first embodiment of the local oscillation circuit of the present invention.
Figure 6:
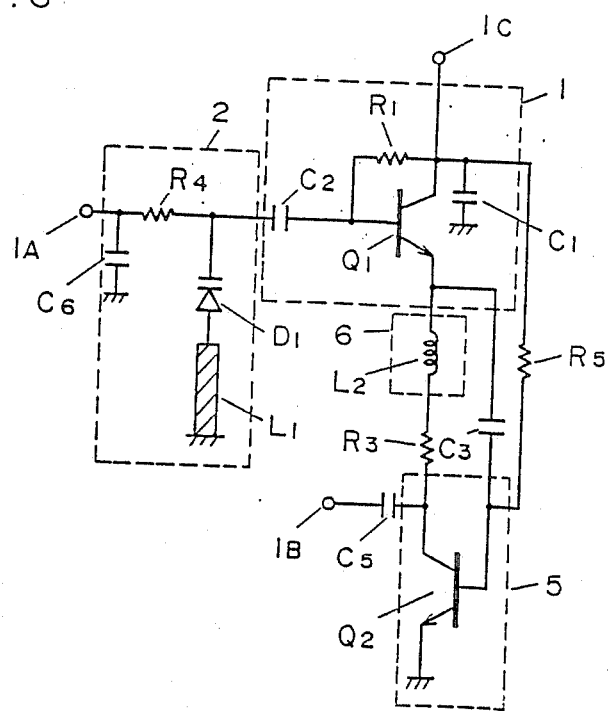
FIG. 6 is a circuit diagram of FIG. 5.

FIG. 5 and FIG. 6 show a first embodiment of the present invention. In FIG. 5, a resonance circuit 2 is connected to an oscillation amplifier 1. The resonance circuit 2 is fed with a tuning voltage from a terminal 1A. The resonant frequency of oscillation from the resonance circuit 2 and the oscillation amplifier 1 can be varied by the tuning voltage. A source voltage Vcc is supplied to the oscillation amplifier 1 from a power supply terminal 1C and is connected to a current-source-and-amplifier 5 through a d.c. path. In the d.c. path, an a.c. removing filter 6, which cuts off any a.c. component, is inserted between the oscillation amplifier circuit 1 and the current-source-amplifier 5. An a.c. output signal of the oscillation amplifier 1 is fed to an a.c. input terminal of the current-source-and-amplifier 5 through an a.c. path and is output through a terminal 1B after being amplified.

FIG. 6 shows a diagram of the local oscillation circuit shown in FIG. 5. Because the basic operation of the oscillation circuit of the present invention is the same as the previously discussed prior art, a discussion of the basic circuit operation is omitted and most of the circuit elements performing similar functions will not be discussed.

The choke coil $L_2$ is connected to the emitter of oscillation transistor $Q_1$, and the oscillation output signal is taken from the junction point of these through the coupling capacitor $C_3$. The choke coil $L_2$ is connected to the collector of the transistor $Q_2$ of the current-source-and-amplifiers through the damping resistor $R_3$ and functions as an a.c. removing filter. Because of the choke coil $L_2$, the oscillation output signal is neither directly fed or transmitted to the collector of transistor $Q_2$. The oscillation output signal is fed to the base of transistor $Q_2$ through the coupling capacitor $C_3$ for amplifying. The output signal amplified here is fed to a next stage from the collector through the oscillation output terminal 1B. Bias for the transistor $Q_2$ is given to its base from the positive power source terminal 1C through the bias resistor $R_5$.

By providing the constant current circuit to the emitter of the oscillation transistor $Q_1$, current changes caused by frequency changes can be reduced without increasing the operation current and any redundant circuit. Further, by separating the constant current circuit and the oscillation circuit with respect to AC, and amplifying, the output signal of the oscillation circuit using the constant current circuit, the amplified output is obtainable without an increased consumption of power in the circuit.

Figure 7:
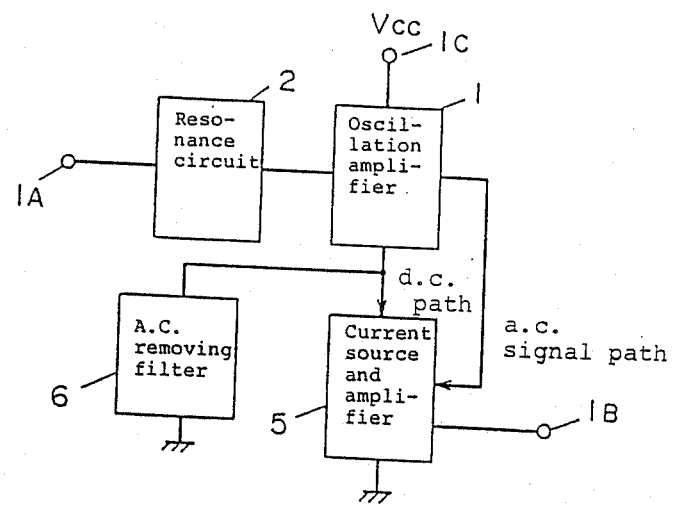
FIG. 7 is a block diagram of a local oscillation circuit in a second embodiment of the present invention.
Figure 8:
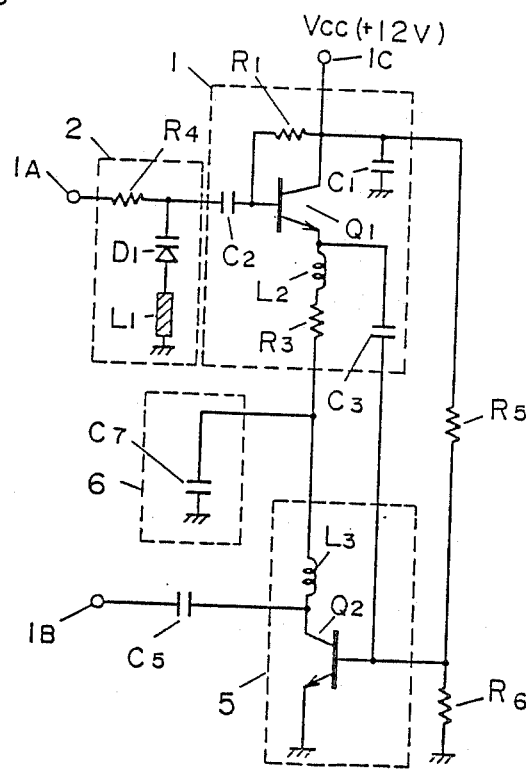
FIG. 8 is a circuit diagram of FIG. 7.

A local oscillation circuit in a second embodiment of the present invention is shown in FIG. 7 and FIG. 8. As shown in FIG. 7, the resonance circuit 2 is connected to the oscillation amplifier 1. To the resonance circuit 2, the tuning voltage is applied from the terminal IA, to vary the resonant frequency of the oscillation circuit comprised of the resonance circuit 2 and the oscillation amplifier 1. The supply voltage Vcc is supplied to the oscillation amplifier 1 from the power supply terminal 1C. The oscillation amplifier 1 is connected to the current-source-and-amplifier 5 through the d.c. path. In the d.c. path, another a.c. removing filter 6 is inserted between the ground for eliminating any a.c. component. The a.c. output signal of the oscillation amplifier 1 is given to an a.c. input terminal of the current-sourceand-amplifier 5 through the a.c. path; the amplified signal can be obtained from the terminal 1B.

FIG. 8 shows a circuit diagram of FIG. 7, and the blocks encircled by broken lines in the figure correspond to FIG. 7. As is similar to FIG. 6, in the oscillation amplifier 1, the impedance seen from the base of transistor $Q_1$ has negative characteristics by grounding the collector of the transistor $Q_1$ through a large capacitance $C_1$. The resonant circuit constituted of the variable capacitance diode $D_1$ and resonance strap $L_1$ is connected in series to the base of transistor $Q_1$ through the coupling capacitor $C_2$. The other end of the series circuit is grounded. A cathode of the variable capacitance diode $D_1$ is supplied with the tuning potential from the terminal 1A through the resistor $R_4$.

Also, similar to FIG. 6 is that to the base of oscillation transistor $Q_1$, a bias is given from the collector through the bias resistor $R_1$. However, to the emitter of transistor $Q_1$ a capacitor $C_7$ that serves as an a.c. removing filter is also connected through the coil $L_2$ and the resistor $R_3$ for high frequency removing. The d.c. component is fed to the collector of amplifier transistor $Q_2$ through the coil $L_3$ for further high frequency removing.

The base of the transistor $Q_2$ is supplied with a potential having a value divided by the resistors $R_5$, $R_6$ from the source voltage Vcc.

Also, similar to FIG. 6 is that the transistor $Q_2$ becomes a constant current source with regard to direct current by grounding its emitter and the oscillation output signal is fed to the base of transistor $Q_2$ through the coupling capacitor $C_3$. The transistor $Q_2$ amplifies the oscillation output signal and feeds the amplified signal to the external load from the collector through the coupling capacitor $C_5$.

The resulting constant current effect, even with variation of the tuning potential and variation of the current of the oscillation transistor $Q_1$, according to the experiments, causes the current flowing in the transistor $Q_1$ to stay within the range of about 20 mA to 22 mA rather than 15 mA to 30 mA as in the prior art circuits. Also, the current does not become greater than the collector dissipation of the transistor and operation is stable.

Figure 9:
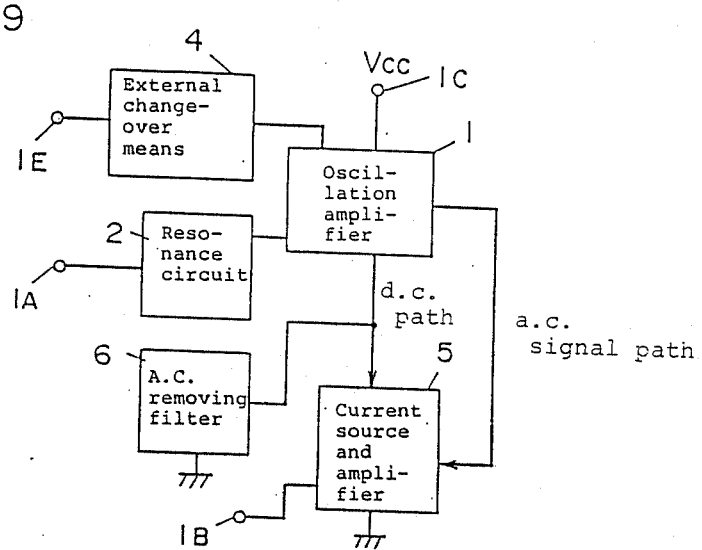
FIG. 9 is a block diagram of a local oscillation circuit in a third embodiment of the present invention.
Figure 10:
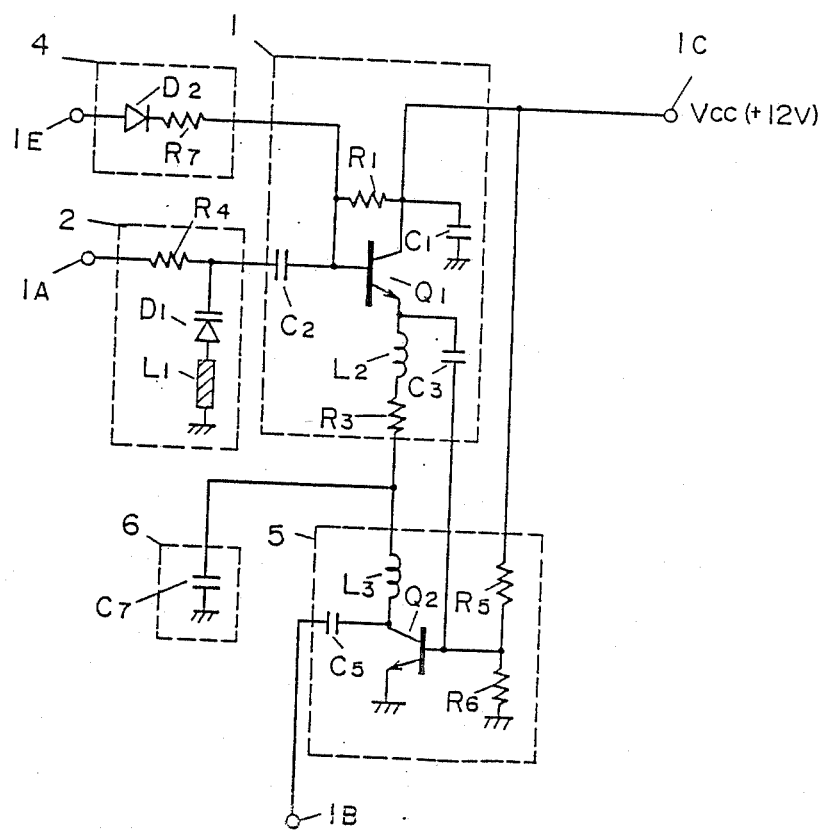
FIG. 10 is a circuit diagram of FIG. 9.

A local oscillation circuit in a third embodiment of the present invention is shown in FIG. 9 and FIG. 10. As shown in FIG. 9, the amplifier 1 for oscillation is connected to the resonance circuit 2 and an external change-over means 4. The resonance circuit 2 is supplied with the tuning voltage from the terminal 1A to vary the resonant frequency of the circuit constituted from the resonance circuit 2 and the amplifier 1 as in previous embodiments.

However, the external change-over means 4 is supplied with a change-over potential from terminal 1E to vary the potential between the base and collector of the transistor of the oscillation amplifier 1 by the amount of the change-over potential. The oscillation amplifier 1 is supplied with the source voltage Vcc from the source terminal 1c, and it is connected to the current-source-and-amplifier 5 through a d.c. path as previously discussed with reference to FIG. 6 with the a.c. removing filter 6 inserted in the d.c. path for further removing a.c. components. The a.c. output signal of the oscillation amplifier 1 is supplied to an a.c. input terminal of the current-source-and-amplifier 5 through the a.c. path; the amplified signal can be obtained from the terminal 1B.

FIG. 10 shows a circuit diagram of FIG. 9. Blocks encircled with broken lines in FIG. 10 correspond to FIG. 9. Parts of the circuit of FIG. 10 are similar to the circuit of FIG. 8. In the oscillation amplifier 1, the impedance seen from the base of transistor $Q_1$ has negative characteristics by grounding the collector of transistor $Q_1$ through a large capacitor $C_1$. The resonant circuit consists of the variable capacitance diode $D_1$ and the resonance strap $L_1$ connected in series to the base of transistor $Q_1$ through the coupling by-pass capacitor $C_2$. The other end of the series circuit is grounded. A cathode of the variable capacitance diode $D_1$ is supplied with the tuning potential from the terminal 1A through the resistor $R_4$.

Different from FIG. 8 is that the base of oscillation transistor $Q_1$ is given a bias from the collector through the bias resistor $R_1$, and the external change-over potential is supplied from the change-over terminal 1E through the resistor $R_7$ and the diode $D_2$.

In the embodiment shown in FIG. 10, only when the change-over potential is high can the base potential of transistor $Q_1$ be raised. If the polarity of the diode $D_2$ is reversed, the base potential of transistor $Q_1$ can be dropped only when the change-over voltage is low. If diode $D_2$ is omitted, the base voltage of transistor $Q_1$ can be made variable so that it will correspond to the value of the change-over potential. Selection of any configuration of diode $D_2$ is possible.

Also similar to FIG. 8 is that a capacitor $C_7$ for the a.c. removing filter is connected to the emitter of transistor $Q_1$ through the coil $L_2$ and resistor $R_3$ for high frequency removing. Therefore, the high frequency component is removed, and the d.c. component is fed to the collector of amplifier transistor $Q_2$ through the coil $L_3$ for high frequency removing. The capacitance $C_7$ may be made by using capacitance that exists between copper foils of a substrate. To the base of the transistor $Q_2$ is impressed a potential divided from power source Vcc by the resistors $R_5$ and $R_6$; the transistor $Q_2$ becomes a constant current source with regard to direct current by grounding its emitter.

Also similar to FIG. 8 is that the oscillation output signal is fed to the base of transistor $Q_2$ from the emitter of transistor $Q_1$ through the coupling capacitor $C_3$. The transistor $Q_2$ amplifies the oscillation output signal and feeds the amplified signal to the external load from the collector through the coupling capacitor $C_5$. By such constant current effect, even with variation of the tuning voltage and variation of the current of the oscillation transistor $Q_1$, the current will remain between, and is reduced to 20 mA to 22 mA. Therefore, the current does not go over the collector dissipation of the transistor and operation by increasing the reverse bias capacitance Cob becomes stable.

Figure 11:
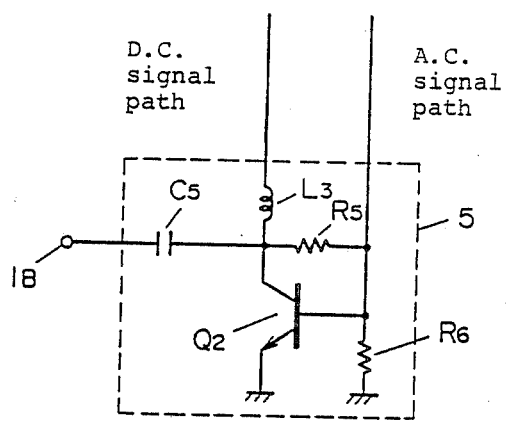
FIG. 11 is a circuit diagram showing another example of the main part of the local oscillation circuit in an embodiment of the present invention.

FIG. 11 shows another example of the current-source-and-amplifier 5. By dividing the direct current voltage from the collector of transistor $Q_2$ by the resistors $R_5$ and $R_6$ and supplying it to the base of transistor $Q_2$, the bias is supplied. With the above arrangement, fluctuations of collector current caused by variations of the base voltage of transistor $Q_1$ can also be suppressed to a level that practical use is possible, although the arrangements shown in FIG. 6, FIG. 8, and FIG. 10 are better. The difference in the current between the circuits of FIG. 10 and FIG. 11 is only several mA and almost no problem.

While the invention has been described in connection with what is presently considered to be the most practical and preferred embodiment, it is to be understood that the invention is not limited to the disclosed embodiments but, on the contrary is intended to cover various modifications and equivalent arrangements included within the spirit and scope of the appended claims.

We claim:

1. A local oscillator circuit comprising:

an oscillation transistor having a base, an emitter, and a collector, said oscillation transistor producing an oscillation output signal at said emitter of said oscillation transistor;

a power input connected to said collector of said oscillation transistor;

means for grounding an alternating current connected to said collector of said oscillation transistor;

resonance circuit means for producing a resonant signal of at least one predetermined frequency connected to said base of said oscillation transistor, said resonance circuit means including a series combination of a variable capacitance diode and a resonator;

an amplifier transistor having a base, an emitter, and a collector, said amplifier transistor producing an amplified oscillation output signal at said collector of said amplifier transistor;

means for reducing an alternating current component of said oscillation signal so that a direct current signal can pass, said alternating current reducing means connected between said emitter of said oscillation transistor and said collector of said amplifier transistor;

means for suppling said oscillation output signal to said base of said amplifier transistor;

means for biasing said amplifier transistor to produce a bias potential on said amplifier transistor; and an output connected to said collector of said amplifier transistor.

2. A local oscillation circuit according to claim 1 further including a change-over voltage input means connected to said base of said oscillation transistor for allowing a change-over voltage to be supplied to said base of said oscillation transistor to vary a base voltage of said oscillation transistor.

3. A local oscillation circuit according to claim 1 further including a tuning voltage input connected to said resonance circuit means for allowing said resonant signal to have one of a plurality of different frequencies when one of a plurality of different tuning voltages is applied to said tuning voltage input.

4. A local oscillation circuit according to claim 3 further including a change-over voltage input means connected to said base of said oscillation transistor for allowing a change-over voltage to be supplied to said base of said oscillation transistor.

* * * * *